(12) United States Patent
Kuo et al.

(10) Patent No.: US 11,437,547 B2
(45) Date of Patent: Sep. 6, 2022

(54) ELECTRODE STRUCTURE OF LIGHT EMITTING DEVICE

(71) Applicant: EPISTAR CORPORATION, Hsinchu (TW)

(72) Inventors: De-Shan Kuo, Hsinchu (TW);
Ting-Chia Ko, Hsinchu (TW);
Chun-Hsiang Tu, Hsinchu (TW);
Po-Shun Chiu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 99 days.

(21) Appl. No.: 17/102,171

(22) Filed: Nov. 23, 2020

(65) Prior Publication Data

US 2021/0074890 A1 Mar. 11, 2021

Related U.S. Application Data

(63) Continuation of application No. 16/510,502, filed on Jul. 12, 2019, now Pat. No. 10,847,682, which is a
(Continued)

(51) Int. Cl.
| | |
|---|---|
| *H01L 29/06* | (2006.01) |
| *H01L 33/42* | (2010.01) |
| *H01L 33/40* | (2010.01) |
| *H01L 27/15* | (2006.01) |
| *H01L 33/06* | (2010.01) |

(Continued)

(52) U.S. Cl.
CPC .............. *H01L 33/42* (2013.01); *H01L 27/15* (2013.01); *H01L 33/06* (2013.01); *H01L 33/08* (2013.01); *H01L 33/30* (2013.01); *H01L 33/32* (2013.01); *H01L 33/405* (2013.01); *H01L 33/60* (2013.01); *H01L 33/62* (2013.01); *H01L 27/156* (2013.01);
(Continued)

(58) Field of Classification Search
CPC ....................................................... H01L 33/42
See application file for complete search history.

(56) References Cited

U.S. PATENT DOCUMENTS

| | | | | |
|---|---|---|---|---|
| 4,317,086 A | * | 2/1982 | Scifres ..................... | H01S 5/028 372/49.01 |
| 4,984,034 A | * | 1/1991 | Yamazaki ............... | H01L 33/08 257/65 |

(Continued)

FOREIGN PATENT DOCUMENTS

| | | |
|---|---|---|
| CN | 1993837 A | 7/2007 |
| CN | 101123291 A | 2/2008 |

(Continued)

*Primary Examiner* — Caleb E Henry
(74) *Attorney, Agent, or Firm* — Ditthavong, Steiner & Mlotkowski

(57) ABSTRACT

A light-emitting device, comprising: a substrate; a semiconductor stacking layer comprising a first type semiconductor layer on the substrate, an active layer on the first semiconductor layer, and a second semiconductor layer on the active layer; and an electrode structure on the second semiconductor layer, wherein the electrode structure comprises a bonding layer, a conductive layer, and a first barrier layer between the bonding layer and the conductive layer; wherein the conductive layer has higher standard oxidation potential than that of the bonding layer.

20 Claims, 3 Drawing Sheets

Related U.S. Application Data continuation of application No. 16/019,136, filed on Jun. 26, 2018, now Pat. No. 10,411,177, which is a continuation of application No. 15/854,462, filed on Dec. 26, 2017, now Pat. No. 10,038,129, which is a continuation of application No. 15/357,334, filed on Nov. 21, 2016, now Pat. No. 9,893,257, which is a continuation of application No. 15/049,917, filed on Feb. 22, 2016, now Pat. No. 9,530,948, which is a continuation of application No. 13/854,212, filed on Apr. 1, 2013, now Pat. No. 9,293,656.

(60) Provisional application No. 61/721,737, filed on Nov. 2, 2012.

(51) Int. Cl.
   *H01L 33/08* (2010.01)
   *H01L 33/30* (2010.01)
   *H01L 33/32* (2010.01)
   *H01L 33/60* (2010.01)
   *H01L 33/62* (2010.01)
   *H01L 33/22* (2010.01)
   *H01L 33/00* (2010.01)

(52) U.S. Cl.
   CPC .......... *H01L 33/0095* (2013.01); *H01L 33/22* (2013.01); *H01L 33/40* (2013.01)

(56) References Cited

U.S. PATENT DOCUMENTS

| | | | | |
|---|---|---|---|---|
| 5,383,214 A * | 1/1995 | Kidoguchi | ............ | H01S 5/2231 372/45.01 |
| 5,661,074 A * | 8/1997 | Tischler | ............... | H01L 33/007 257/E33.068 |
| 5,803,579 A * | 9/1998 | Turnbull | ............... | B60L 3/0023 362/800 |
| 5,841,128 A * | 11/1998 | Shibuya | ............... | H04N 1/0315 257/E31.127 |
| 5,874,747 A * | 2/1999 | Redwing | ................. | H01L 33/44 257/E33.068 |
| 5,930,279 A * | 7/1999 | Apollonov | .............. | H01S 5/023 372/50.12 |
| 6,194,743 B1 * | 2/2001 | Kondoh | .................. | H01L 33/40 257/745 |
| 6,635,901 B2 * | 10/2003 | Sawaki | .................... | H01L 33/20 257/94 |
| 6,825,502 B2 | 11/2004 | Okazaki et al. | | |
| 6,958,498 B2 | 10/2005 | Shelton et al. | | |
| 7,135,711 B2 * | 11/2006 | Linder | .................... | H01L 33/08 257/E33.068 |
| 7,719,013 B2 * | 5/2010 | Lee | .................... | H01L 25/0753 257/85 |
| 7,786,493 B2 * | 8/2010 | Watanabe | ................ | H01L 33/40 257/89 |
| 7,834,370 B2 * | 11/2010 | Koya | ...................... | H01L 33/60 257/E27.072 |
| 8,022,419 B2 * | 9/2011 | Yasuda | .................. | H01L 33/38 257/91 |
| 8,058,082 B2 * | 11/2011 | Yu | .......................... | H01L 33/32 438/42 |
| 8,058,663 B2 * | 11/2011 | Fan | ......................... | H01L 27/15 257/89 |
| 8,115,212 B2 | 2/2012 | Miki et al. | | |
| 8,232,120 B2 * | 7/2012 | Seko | .................. | H01L 33/0093 257/E33.068 |
| 8,272,757 B1 * | 9/2012 | Fan | ..................... | H01L 25/0753 362/800 |
| 8,324,639 B2 | 12/2012 | Fudeta et al. | | |
| 8,502,465 B2 | 8/2013 | Katona et al. | | |
| 8,552,455 B2 | 10/2013 | Lee et al. | | |
| 2002/0014630 A1 | 2/2002 | Okazaki et al. | | |
| 2003/0087467 A1 * | 5/2003 | Oohata | ................... | H01L 33/22 438/47 |
| 2004/0213017 A1 * | 10/2004 | Chou | ................ | G02F 1/133603 362/558 |
| 2004/0238834 A1 * | 12/2004 | Yasuoka | .............. | H05K 1/0274 257/88 |
| 2005/0023550 A1 * | 2/2005 | Eliashevich | ........ | H01L 33/0093 438/22 |
| 2005/0179044 A1 * | 8/2005 | Oohata | ................ | H01L 25/0753 257/89 |
| 2005/0254243 A1 * | 11/2005 | Jiang | .................... | H01L 27/156 315/246 |
| 2005/0277218 A1 | 12/2005 | Nakajo et al. | | |
| 2006/0097270 A1 | 5/2006 | Yuri | | |
| 2006/0102912 A1 * | 5/2006 | Abe | ...................... | H01L 51/5262 257/E33.068 |
| 2006/0175621 A1 * | 8/2006 | Ohtsuka | ................ | H01L 27/156 438/30 |
| 2006/0180818 A1 * | 8/2006 | Nagai | ........................ | F21K 9/00 257/89 |
| 2006/0214173 A1 * | 9/2006 | Beeson | ................. | H01L 33/385 257/88 |
| 2007/0023777 A1 * | 2/2007 | Sonobe | .................... | H01L 33/40 257/E25.02 |
| 2007/0176188 A1 * | 8/2007 | Tanaka | .................... | H01L 33/46 257/88 |
| 2007/0190676 A1 * | 8/2007 | Chu | ........................ | H01L 33/20 438/22 |
| 2007/0215878 A1 * | 9/2007 | Wuu | ...................... | H01L 33/08 257/72 |
| 2007/0241348 A1 | 10/2007 | Inoue et al. | | |
| 2007/0246735 A1 | 10/2007 | Yahata et al. | | |
| 2007/0262323 A1 * | 11/2007 | Sonobe | ................... | F21V 3/061 257/77 |
| 2007/0262331 A1 | 11/2007 | Ogihara et al. | | |
| 2007/0278502 A1 * | 12/2007 | Shakuda | .................. | C09K 11/584 257/E33.059 |
| 2008/0142814 A1 * | 6/2008 | Chu | ........................ | H01L 33/20 438/42 |
| 2008/0145961 A1 * | 6/2008 | Horio | ........................ | H01L 33/08 257/E33.068 |
| 2008/0149945 A1 * | 6/2008 | Nagai | ...................... | H01L 24/18 257/E33.068 |
| 2008/0149946 A1 * | 6/2008 | Kim | ........................ | H01L 33/08 257/89 |
| 2008/0157109 A1 | 7/2008 | Hon | | |
| 2008/0237622 A1 * | 10/2008 | Choi | ..................... | H01L 33/382 257/E33.062 |
| 2008/0251796 A1 * | 10/2008 | Lee | ......................... | H01L 33/24 257/E33.064 |
| 2008/0251808 A1 * | 10/2008 | Kususe | ................. | H01L 33/385 257/E33.001 |
| 2008/0258156 A1 * | 10/2008 | Hata | ....................... | H01L 24/05 257/E33.056 |
| 2009/0008661 A1 * | 1/2009 | Arimitsu | ................ | H01L 24/14 257/E33.068 |
| 2009/0085048 A1 * | 4/2009 | Lee | ....................... | H01L 27/156 257/89 |
| 2009/0121241 A1 * | 5/2009 | Keller | .................... | H01L 33/08 257/E33.068 |
| 2009/0184329 A1 | 7/2009 | Miki et al. | | |
| 2009/0212318 A1 * | 8/2009 | Fudeta | .................... | H01L 33/62 257/E33.066 |
| 2009/0242910 A1 * | 10/2009 | Murofushi | .............. | H01L 24/05 257/E33.012 |
| 2009/0267085 A1 * | 10/2009 | Lee | ......................... | H01L 33/36 257/E33.056 |
| 2010/0032696 A1 * | 2/2010 | Yu | ........................... | H01L 33/22 257/E33.014 |
| 2010/0065869 A1 * | 3/2010 | Arai | ..................... | H01L 33/0093 257/98 |
| 2010/0096657 A1 | 4/2010 | Ou et al. | | |
| 2010/0237384 A1 | 9/2010 | Choo et al. | | |
| 2011/0018022 A1 | 1/2011 | Okabe et al. | | |
| 2011/0068349 A1 | 3/2011 | Shinohara et al. | | |
| 2011/0089401 A1 | 4/2011 | Hiraiwa et al. | | |

(56) References Cited

U.S. PATENT DOCUMENTS

| | | | |
|---|---|---|---|
| 2011/0114984 A1* | 5/2011 | Seong | H01L 21/76254 438/33 |
| 2011/0140100 A1 | 6/2011 | Takata et al. | |
| 2011/0140135 A1* | 6/2011 | Lee | H01L 33/20 257/88 |
| 2011/0198567 A1* | 8/2011 | Shinohara | H01L 33/22 257/E33.012 |
| 2011/0266568 A1 | 11/2011 | Aldaz et al. | |
| 2011/0284903 A1* | 11/2011 | Loh | H01L 33/486 257/E33.059 |
| 2012/0113658 A1 | 5/2012 | Sakai | |
| 2012/0138999 A1* | 6/2012 | Okabe | H01L 33/405 257/E33.072 |
| 2012/0199861 A1 | 8/2012 | Tsuji | |
| 2012/0235204 A1* | 9/2012 | Hodota | H01L 33/405 257/E33.068 |
| 2012/0305889 A1 | 12/2012 | Lim et al. | |
| 2013/0026525 A1* | 1/2013 | Chen | H01L 33/10 257/E33.072 |
| 2013/0056785 A1 | 3/2013 | Hwang | |
| 2013/0069095 A1* | 3/2013 | Hodota | H01L 33/42 257/E33.072 |
| 2013/0119420 A1 | 5/2013 | Choi et al. | |
| 2013/0119424 A1* | 5/2013 | Kang | H01L 33/50 257/98 |
| 2013/0126919 A1* | 5/2013 | Yamasaki | H01L 33/145 257/E33.014 |
| 2013/0181239 A1* | 7/2013 | Lee | H01L 33/405 257/88 |
| 2013/0299858 A1 | 11/2013 | Kar et al. | |
| 2013/0341661 A1* | 12/2013 | Higashino | H01L 33/405 438/43 |
| 2014/0124807 A1* | 5/2014 | Kuo | H01L 33/06 257/98 |
| 2014/0183588 A1* | 7/2014 | Tokunaga | H01L 33/387 257/98 |
| 2014/0377895 A1* | 12/2014 | Seong | H01L 33/40 438/27 |
| 2015/0060895 A1* | 3/2015 | Zeng | H01L 33/20 438/34 |
| 2016/0172557 A1* | 6/2016 | Kuo | H01L 33/60 257/98 |

FOREIGN PATENT DOCUMENTS

| | | |
|---|---|---|
| CN | 1330416 A | 1/2011 |
| CN | 101971368 A | 2/2011 |
| CN | 102484185 A | 5/2012 |
| TW | 200610200 A | 3/2006 |

* cited by examiner

ELECTRODE STRUCTURE OF LIGHT EMITTING DEVICE

REFERENCE TO RELATED APPLICATION

This application is a continuation application of U.S. patent application Ser. No. 16/510,502, filed on Jul. 12, 2019, which is a continuation application of U.S. patent application Ser. No. 16/019,136, filed on Jun. 26, 2018, which is a continuation application of U.S. patent application Ser. No. 15/854,462, filed on Dec. 26, 2017, now issued, which is a continuation application of U.S. patent application Ser. No. 15/357,334, filed on Nov. 21, 2016, now issued, which is a continuation application of U.S. patent application Ser. No. 15/049,917, filed on Feb. 22, 2016, now issued, which is a continuation application of U.S. patent application Ser. No. 13/854,212, filed on Apr. 1, 2013, now issued, which claims the right of priority based on U.S. Provisional Application No. 61/721,737, filed on Nov. 2, 2012 and the contents of which are hereby incorporated by references in their entireties.

TECHNICAL FIELD

The present application relates to a light-emitting device with an excellent electrode structure to improve the reliability thereof.

DESCRIPTION OF BACKGROUND ART

As the light-emitting efficiency is increased and the cost of manufacturing is decreased, the dream for solid lighting device to replace the traditional lighting device may come true in recent years. Currently, the internal light-emitting efficiency of the light-emitting diode is about 50% to 80%, but a part of the light may be absorbed by the electrode or the light-emitting layer so the total light-emitting efficiency is degraded. Therefore, the mirror layer under the electrode has been provided to solve the problem. When the route of the light extracted from the light-emitting layer is blocked by the electrode, the mirror can reflect but not absorbs the light. On the other hand, the electrode has a bonding pad for wire bonding, and the bonding pad is usually made of gold (Au). Since gold (Au) is very expensive, the cost of the electrode is increased.

SUMMARY OF THE DISCLOSURE

A light-emitting device, comprising: a substrate; a semiconductor stacking layer comprising a first type semiconductor layer on the substrate, an active layer on the first semiconductor layer, and a second semiconductor layer on the active layer; and an electrode structure on the second semiconductor layer, wherein the electrode structure comprises a bonding layer, a conductive layer, and a first barrier layer between the bonding layer and the conductive layer; wherein the conductive layer has higher standard oxidation potential than that of the bonding layer.

DETAILED DESCRIPTION OF PREFERRED EMBODIMENTS

Figure 1A:
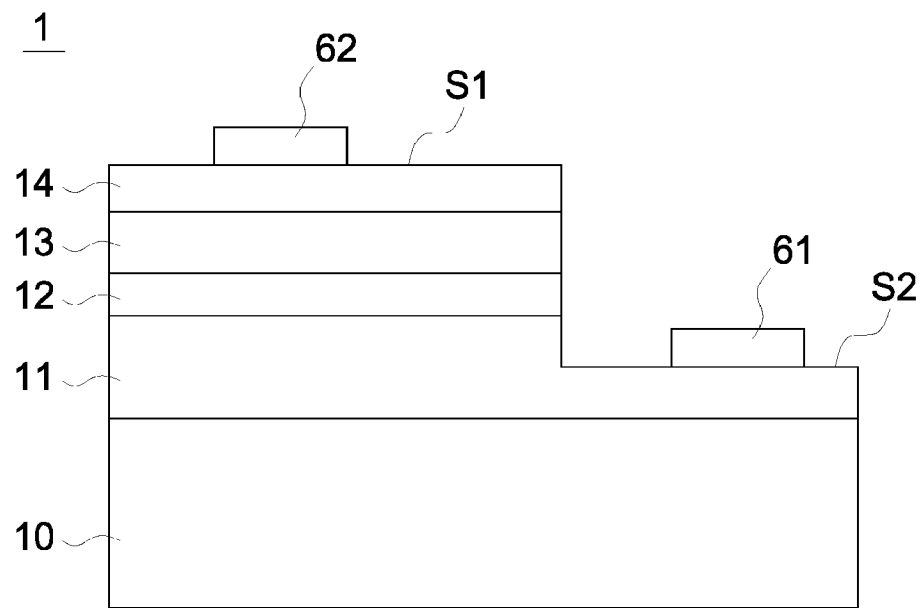
FIGS. 1A and 1B show a light-emitting device in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

FIG. 1A shows a light-emitting device 1 comprising a substrate 10, a first semiconductor layer 11 having a first polarity, such as an n-type GaN layer, on the substrate 10, an active layer 12 having a structure, such as InGaN-based multiple-quantum-well (MQW) structure, on the first semiconductor layer 11, a second semiconductor layer 13 having a second polarity, such as a p-type GaN layer, on the active layer 12, a transparent conductive oxide layer 14 comprising a first metal material, such as indium tin oxide (ITO), on the second semiconductor layer 13, a top surface S2 of the first semiconductor layer 11 revealed from the active layer 12 and the second semiconductor layer 13, a first electrode structure 61 on the top surface S2, and a second electrode structure 62 on a top surface 51 of the transparent conductive oxide layer 14.

Figure 1B:
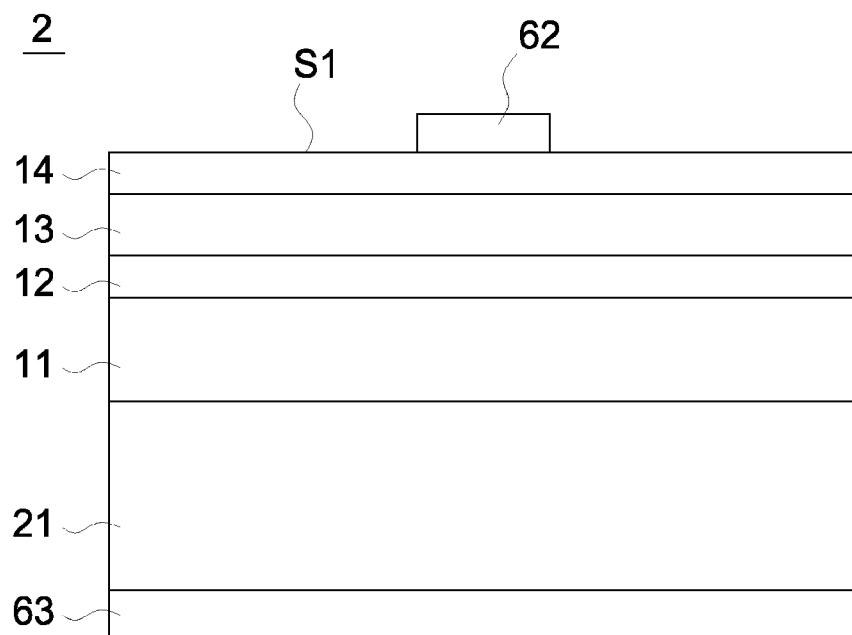

The substrate 10 can be an insulating substrate, such as sapphire. In another embodiment, a vertical-type light-emitting device 2 is also disclosed in FIG. 1B by arranging a third electrode structure 63 and the second electrode structure 62 on opposite sides of a conductive substrate 21. The conductive substrate 21 comprises a conductive material, such as metal, e.g. Cu, Al, In, Sn, Zn, W or the combination thereof, or semiconductor, e.g. Si, SiC, GaN, GaAs, etc.

The material of the first semiconductor layer 11, the active layer 12, and the second semiconductor layer 13 comprise group III-V compound semiconductor, such as gallium phosphide (GaP), gallium arsenide (GaAs), or gallium nitride (GaN). The first semiconductor layer 11, the second semiconductor layer 13, or the active layer 12 may be formed by a known epitaxy method such as metallic-organic chemical vapor deposition (MOCVD) method, a molecular beam epitaxy (MBE) method, or a hydride vapor phase epitaxy (HVPE) method.

The material of the transparent conductive oxide layer 14 comprises transparent conductive oxide material, such as indium tin oxide (ITO), cadmium tin oxide (CTO), antimony tin oxide, indium zinc oxide, zinc aluminum oxide, zinc oxide, and zinc tin oxide. The transparent conductive oxide layer 14 has a predetermined thickness such as smaller than 3000 angstroms and if formed by a evaporation deposition method under chamber conditions of around room temperature, N2 ambient environment, and a pressure between $1\times10^{-4}$ Torr and $1\times10^{-2}$ Torr, or preferably around $5\times10^{-3}$ Torr.

First Embodiment

Figure 2:
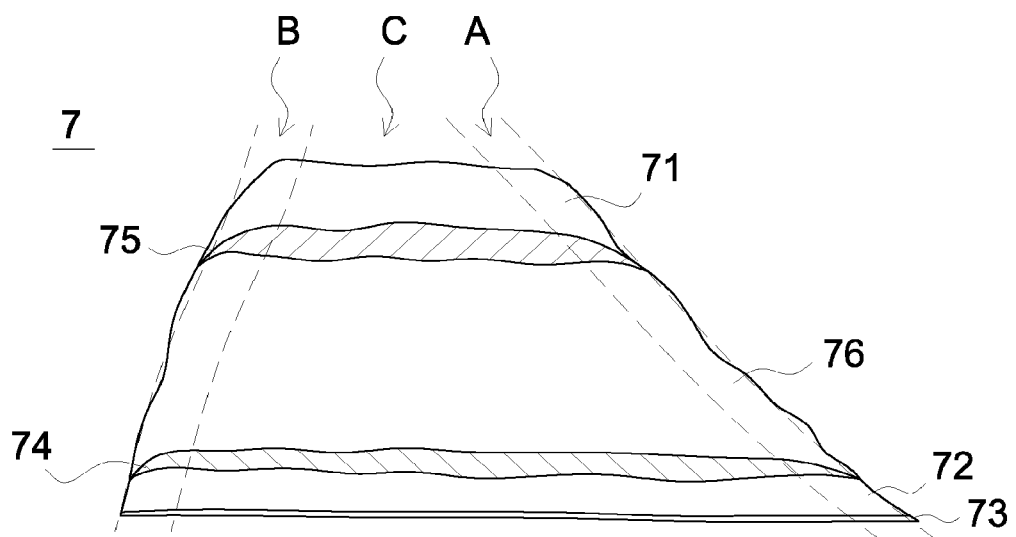
FIG. 2 shows the detailed structure of an electrode structure in accordance with the first embodiment of the present application.

FIG. 2 shows an electrode structure 7 which details the first electrode structure 61, the second electrode structure 62, and the third electrode structure 63 in accordance with the first embodiment. The electrode structure 7 comprises a bonding layer 71 for wire bonding, a conductive layer 76 under the bonding layer 71, a mirror layer 72 under the conductive layer 76 for reflecting the light emitted from the active layer 12, an adhesion layer 73 for increasing the adhesion between the mirror layer 72 and the transparent conductive structure 14 or the first semiconductor layer 11, a second barrier layer 74 between the conductive layer 76 and the mirror layer 72 for separating the conductive layer 76 from directly contacting the mirror layer 72, and a first barrier layer 75 between the bonding layer 71 and the conductive layer 76 for separating the conductive layer 76 from directly contacting the bonding layer 71.

The bonding layer 71 comprises a first metal, e.g. Au. The thickness of the bonding layer 71 is between 1000 Å and 42000 Å, and preferably is between 5000 Å and 10000 Å. The conductive layer 76 comprises a second metal different from the first metal, e.g. Al, Ag, or Cu. The electrical conductivity of the second metal is 0.1~10 times the electrical conductivity of the first metal. The first metal is more chemically stable than the second metal, or the second metal has higher standard oxidation potential than the first metal. The thickness of the conductive layer 76 is 0.1~10 times the thickness of the bonding layer 71. The thickness of the conductive layer 76 depends on the amount of operating current flowing through the electrode structure 7. If the electrical conductivity of the bonding layer 71 is smaller than that of the conductive layer 76 under a low to moderate driving current injected into the electrode structure 7, e.g. 120 mA~300 mA, a first ratio of the thickness of the conductive layer 76 to the total thickness of the electrode structure 7 is between 0.3 and 0.5. The total thickness of the conductive layer 76 and the bonding layer 71 is about 0.4~0.7 times the total thickness of the electrode structure 7. If the electrical conductivity of the bonding layer 71 is smaller than that of the conductive layer 76 under a high driving current injected into the electrode structure 7, e.g. 350 mA~1000 mA, a second ratio of the thickness of the conductive layer 76 to the total thickness of the electrode structure 7, which is greater than the first ratio, is between 0.5 and 0.8. The total thickness of the conductive layer 76 and the bonding layer 71 is about 0.6~0.9 times the total thickness of the electrode structure 7. If the electrical conductivity of the bonding layer 71 is greater than that of the conductive layer 76, when a low to moderate driving current injects into the electrode structure 7, e.g. 120 mA~300 mA, a third ratio of the thickness of the conductive layer 76 to the total thickness of the electrode structure 7 is between 0.4 and 0.7, or the total thickness of the conductive layer 76 and the bonding layer 71 is about 0.5~0.8 times the total thickness of the electrode structure 7. If the electrical conductivity of the bonding layer 71 is greater than that of the conductive layer 76 under a high driving current injected into the electrode structure 7, e.g. 350 mA~1000 mA, a fourth ratio of the thickness of the conductive layer 76 to the total thickness of the electrode structure 7, which is greater than the third ratio, is between 0.55 and 0.85. The total thickness of the conductive layer 76 and the bonding layer 71 is about 0.75~0.95 times the total thickness of the electrode structure 7. The mirror layer 72 comprises metal having a reflectivity greater than 80% to the light emitted from active layer 12, e.g. Al or Ag. The thickness of the mirror layer 72 is preferably between 500 Å and 5000 Å.

The second barrier layer 74 serves to separate the mirror layer 72 from the conductive layer 76 to prevent the conductive layer 76 from inter-diffusing with the mirror layer 72 at the in-between interface and form low contact resistance and good adhesion between the mirror layer 72 and the bonding layer 71. The second barrier layer 74 comprises a third metal layer and a fourth metal layer stacked on the third metal layer, wherein the fourth metal layer comprises a material different from the third metal layer. In another embodiment, the second barrier layer 74 comprises a plurality of the third metal layers and a plurality of fourth metal layers alternately stacked, e.g. Ti/Pt/Ti/Pt or Ti/Pt/Ti/Pt/Ti/Pt. The third metal layer is preferred about one to three times thicker than the fourth metal layer. The thickness of the third metal layer is between 500 Å and 1500 Å and the thickness of the fourth metal layer is between 250 Å and 750 Å. The third metal layer and the fourth metal layer each comprises a material selected from the group consisting of Cr, Pt, Ti, TiW, W, and Zn. Therefore, the second barrier layer 74 comprises at least two materials selected from the group consisting of Cr/Pt, Cr/Ti, Cr/TW, Cr/W, Cr/Zn, Ti/Pt, Ti/W, Ti/TiW, W, Ti/Zn, Pt/TiW, Pt/W, Pt/Zn, TiW/W, TiW/Zn, and W/Zn. The first barrier layer 75 serves to separate the bonding layer 71 from the conductive layer 76 to prevent the conductive layer 76 from inter-diffusing with the bonding layer 71 at the in-between interface and form low contact resistance and good adhesion between the bonding layer 71 and the conductive layer 76. The first barrier layer 75 comprises a first metal layer and a second metal layer stacked on the first metal layer, wherein the first metal layer comprises a material different from the second metal layer. In another embodiment, the first barrier layer 75 comprises a plurality of the first metal layers and a plurality of second metal layers alternately stacked, e.g. Ti/Pt/Ti/Pt or Ti/Pt/Ti/Pt/Ti/Pt. The first metal layer is preferred about one to three times thicker than the second metal layer. The thickness of the first metal layer is between 500 Å and 1500 Å and the thickness of the second metal layer is between 250 Å and 750 Å. The first metal layer and the second metal layer each comprises a material selected from the group consisting of Cr, Pt, Ti, TiW, W, and Zn. Therefore the first barrier layer 75 comprises at least two materials selected from the group consisting of Cr/Pt, Cr/Ti, Cr/TW, Cr/W, Cr/Zn, Ti/Pt, Ti/W, Ti/TiW, W, Ti/Zn, Pt/TiW, Pt/W, Pt/Zn, TiW/W, TiW/Zn, and W/Zn. The adhesion layer 73 is used to increase adhesion between the mirror layer 72 and the transparent conductive structure 14 or the first semiconductor layer 11. The adhesion layer 73 preferably comprises Cr or Rh. The thickness of the adhesion layer 73 is preferably between 5 Å and 50 Å such that the adhesion layer 73 is thin enough to be pervious to the light emitted from the active layer 12.

For each of the mirror layer 72, the second barrier layer 74, the conductive layer 76, the first barrier layer 75, and the bonding layer 71, the thickness of each of these layers in an edge region A or B is smaller than that in a center region C. The shape of the electrode structure 7 is approximately a trapezoid, or preferred a non-symmetrical trapezoid with two opposite sides having different slopes.

Second Embodiment

Figure 3A:
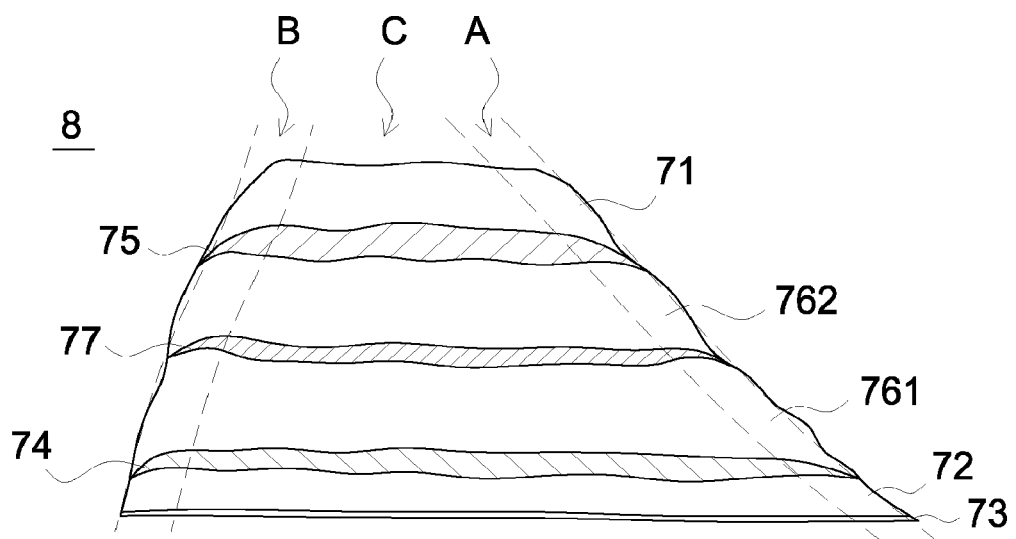
FIGS. 3A and 3B show the detailed structure of an electrode structure in accordance with the second embodiment of the present application.
Figure 3B:
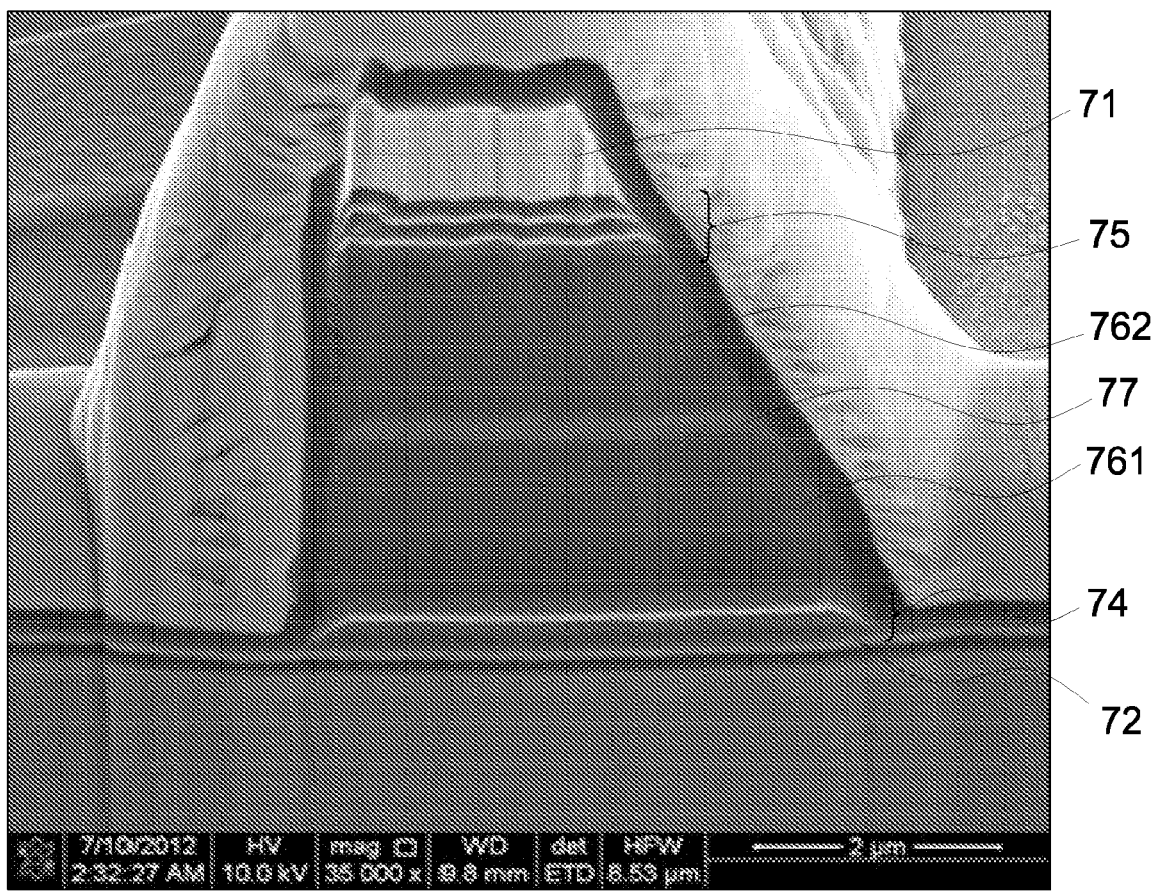

FIG. 3A shows an electrode structure 8 which details the first electrode structure 61, the second electrode structure 62, and the third electrode structure 63 in accordance with the second embodiment. FIG. 3B shows the scanning electron microscope (SEM) figure of the detailed structure of the electrode structure 8. The difference between the electrode structure 8 of FIG. 3A and the electrode structure 7 of FIG. 2 is that the conductive layer 76 of the electrode structure 7 is divided into two parts, i.e. a first conductive layer 761 and a second conductive layer 762, and a third barrier layer 77 is between the first conductive layer 761 and the second conductive layer 762 to reduce out-diffusing of the first conductive layer 761 and the second conductive layer 762 to the bonding layer 71 or the mirror layer 72 caused by electron migration effect when a high driving current injected into the electrode structure 8. The first conductive layer 761 and the second conductive layer 762 comprise substantially the same material, and the thickness of the first conductive layer 761 is about equal to or of the same order as that of the second conductive layer 762. The third barrier layer 77 comprises a material different from the material of the first conductive layer 761 or the second conductive layer 762. The third barrier layer 77 comprises a single metal layer selected from the group consisting of Cr, Pt, Ti, TiW, W, and Zn. The thickness of the single metal layer is between 500 Å and 1500 Å.

For each of the mirror layer 72, the second barrier layer 74, the first conductive layer 761, the third barrier layer 77, the second conductive layer 762, the first barrier layer 75, and the bonding layer 71, the thickness of each of these layers in an edge region A or B is smaller than that in a center region C. The shape of the electrode structure 8 is approximately a trapezoid, or preferred a non-symmetrical trapezoid with two opposite sides having different slopes.

Third Embodiment

Figure 4:
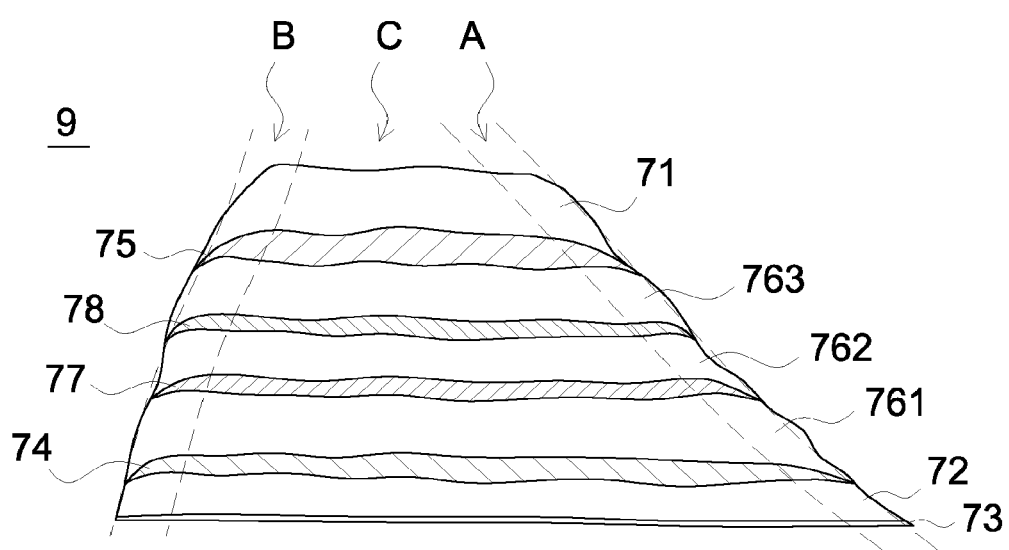
FIG. 4 shows the detailed structure of an electrode structure in accordance with the third embodiment of the present application.

FIG. 4 shows an electrode structure 9 which details the first electrode structure 61, the second electrode structure 62, and the third electrode structure 63 in accordance with the third embodiment. The difference between the electrode structure 9 of FIG. 4 and the electrode structure 7 of FIG. 2 is that the conductive layer 76 of the electrode structure 7 is divided into three parts, i.e. the first conductive layer 761, the second conductive layer 762 and a third conductive layer 763, and the second conductive layer 762 and the third conductive layer 763 is separated by a fourth barrier layer 78. The thicknesses of the first conductive layer 761, the second conductive layer 762 and the third conductive layer 763 are about equal, or of the same order. The fourth barrier layer 78 comprises the same material as the third barrier layer 77.

For each of the mirror layer 72, the second barrier layer 74, the first conductive layer 761, the third barrier layer 77, the second conductive layer 762, the fourth barrier layer 78, the third conductive layer 763, the first barrier layer 75, and the bonding layer 71, the thickness of each of these layers in an edge region A or B is smaller than that in a center region C, and each of these layers in the edge region A or B is bended downward toward the active layer 12. The shape of the electrode structure 9 is approximately a symmetrical trapezoid, or preferred a non-symmetrical trapezoid with two opposite sides having different slopes.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
a first semiconductor layer;
an active layer on the first semiconductor layer;
a second semiconductor layer on the active layer; and
an electrode structure on the second semiconductor layer,
wherein the electrode structure comprises a conductive layer on the second semiconductor layer, a bonding layer on the conductive layer, and a first barrier layer between the bonding layer and the conductive layer,
wherein the first barrier layer comprises a material selected from a group consisting of Cr, Pt, Ti, TiW, W, and Zn, and
wherein a ratio of the thickness of the conductive layer to the total thickness of the electrode structure is between 0.4 and 0.7, or the total thickness of the conductive layer and the bonding layer is about 0.4~0.7 times the total thickness of the electrode structure.

2. A light-emitting device according to claim 1, wherein the conductive layer comprises a first conductive layer and a second conductive layer, and a second barrier layer is between the first conductive layer and the second conductive layer.

3. A light-emitting device according to claim 2, wherein the thickness of the first conductive layer is of the same order as that of the second conductive layer.

4. A light-emitting device according to claim 1, wherein the electrode structure further comprises an adhesion layer between the second semiconductor layer and the conductive layer.

5. A light-emitting device according to claim 4, wherein the adhesion layer comprises Cr or Rh.

6. A light-emitting device according to claim 5, wherein the adhesion layer comprises a thickness between 5 Å and 50 Å.

7. A light-emitting device according to claim 1, further comprising a mirror layer between the second semiconductor layer and the conductive layer, wherein the mirror layer comprises Al or Ag.

8. A light-emitting device according to claim 7, wherein the mirror layer comprises a thickness between 500 Å and 5000 Å.

9. A light-emitting device according to claim 1, wherein the bonding layer comprises a first metal comprising Au, and the conductive layer comprises a second metal comprising Al, Ag or Cu.

10. A light-emitting device according to claim 1, wherein the first barrier layer comprises a first metal layer and a second metal layer.

11. A light-emitting device according to claim 10, wherein the first metal layer is one to three times thicker than the second metal layer.

12. A light-emitting device according to claim 10, wherein the first metal layer comprises a material different from that of the second metal layer.

13. A light-emitting device according to claim 7, further comprising a third barrier layer between the mirror layer and the conductive layer.

14. A light-emitting device according to claim 13, wherein the third barrier layer comprises a plurality of metal layers, and one of the metal layers comprises a material selected from a group consisting of Cr, Pt, Ti, TiW, W, and Zn.

15. A light-emitting device according to claim 13, wherein the third barrier layer comprises the third metal layer and a fourth metal layer stacked on the third metal layer, and the fourth metal layer comprises a material different from that of the third metal layer.

16. A light-emitting device according to claim 1, further comprising a third conductive layer on the second semiconductor layer, and a fourth barrier layer between the second conductive layer and the third conductive layer.

17. A light-emitting device according to claim 16, wherein the fourth barrier layer comprises a fifth metal layer and a sixth metal layer stacked on the fifth metal layer, wherein the sixth metal layer comprises a material different from that of the fifth metal layer.

18. A light-emitting device according to claim 2, wherein the thickness of the first conductive layer is of the same order as that of the second conductive layer.

19. A light-emitting device according to claim 16, wherein the thickness of the third conductive layer is of the same order as those of the second conductive layer and the first conductive layer.

20. A light-emitting device, comprising:

a first semiconductor layer;

an active layer on the first semiconductor layer;

a second semiconductor layer on the active layer; and an electrode structure on the second semiconductor layer, wherein the electrode structure comprises a conductive layer on the second semiconductor layer, a bonding layer on the conductive layer, and a first barrier layer between the bonding layer and the conductive layer, wherein the first barrier layer comprises a material selected from a group consisting of Cr, Pt, Ti, TiW, W, and Zn, and wherein the total thickness of the conductive layer and the bonding layer is about 0.6~0.9 or 0.75~0.95 times the total thickness of the electrode structure.

* * * * *